US012805260B2

(12) United States Patent
Beier

(10) Patent No.: US 12,805,260 B2
(45) Date of Patent: Nov. 17, 2026

(54) ROBOT FOR HANDLING FLAT SUBSTRATES AS WELL AS ALIGNMENT FACILITY

(71) Applicant: Uwe Beier, Ottendorf-Okrilla (DE)

(72) Inventor: Uwe Beier, Ottendorf-Okrilla (DE)

( * ) Notice: Subject to any disclaimer, the term of this patent is extended or adjusted under 35 U.S.C. 154(b) by 389 days.

(21) Appl. No.: 18/551,649

(22) PCT Filed: Jun. 15, 2022

(86) PCT No.: PCT/DE2022/100447
§ 371 (c)(1),
(2) Date: Sep. 21, 2023

(87) PCT Pub. No.: WO2022/262907
PCT Pub. Date: Dec. 22, 2022

(65) Prior Publication Data

US 2024/0178045 A1 May 30, 2024

(30) Foreign Application Priority Data

Jun. 18, 2021 (DE) .................... 10 2021 115 853.2

(51) Int. Cl.
*H10P 72/76* (2026.01)
*B25J 11/00* (2006.01)
*H10P 72/30* (2026.01)

(52) U.S. Cl.
CPC ....... *H10P 72/7602* (2026.01); *B25J 11/0095* (2013.01); *H10P 72/3302* (2026.01); *H10P 72/3311* (2026.01); *H10P 72/3412* (2026.01)

(58) Field of Classification Search
None
See application file for complete search history.

(56) References Cited

U.S. PATENT DOCUMENTS

| | | | | |
|---|---|---|---|---|
| 7,601,272 B2 * | 10/2009 | Nguyen | H10P 72/7602 216/60 |
| 10,090,188 B2 * | 10/2018 | Thanu | H10P 72/7602 |
| 11,254,015 B2 * | 2/2022 | Riff | B25J 15/0253 |
| 11,488,854 B2 * | 11/2022 | Kim | B65G 47/90 |
| 2003/0230384 A1 | 12/2003 | Su et al. | |
| 2014/0007731 A1 | 1/2014 | Hosek et al. | |

(Continued)

FOREIGN PATENT DOCUMENTS

| | | |
|---|---|---|
| JP | H09213768 A | 8/1997 |
| JP | 2007208235 A | 8/2007 |

(Continued)

OTHER PUBLICATIONS

Office Action issued on Sep. 18, 2024, in corresponding Japanese Application No. 2024-504591, 13 pages.

(Continued)

*Primary Examiner* — Michael S Lowe
(74) *Attorney, Agent, or Firm* — Maier & Maier, PLLC

(57) ABSTRACT

A robot for handling flat substrates having one or more substrate holder(s), each substrate holder is for horizontally holding respectively one of the substrates, a carrier block holding the substrate holder or if several substrate holders are provided holding the substrate holders spaced from each other, and a robot arm. The carrier block is attached to the robot arm by an alignment facility, and the alignment facility is for aligning the carrier block.

15 Claims, 7 Drawing Sheets

(56) References Cited

U.S. PATENT DOCUMENTS

| | | | | |
|---|---|---|---|---|
| 2017/0323821 | A1* | 11/2017 | Thanu ................. | H10P 72/7602 |
| 2021/0086373 | A1 | 3/2021 | Riff et al. | |
| 2021/0146554 | A1 | 5/2021 | Hudgens et al. | |

FOREIGN PATENT DOCUMENTS

| | | | |
|---|---|---|---|
| JP | 2015037173 | A | 2/2015 |
| JP | 2021019172 | A | 2/2021 |
| JP | 2021048289 | A | 3/2021 |
| KR | 20030000092 | A | 1/2003 |
| KR | 100767264 | B1 | 10/2007 |
| WO | 9962107 | A1 | 12/1999 |

OTHER PUBLICATIONS

International Preliminary Report on Patentability issued on Dec. 14, 2023 in corresponding application No. PCT/DE2022/100447; 13 pages.

Office Action issued on Dec. 23, 2021, in corresponding German Application No. 10 2021 115 853.2, 14 pages.

International Search Report issued on Sep. 19, 2022 in corresponding application No. PCT/DE2022/100447; 6 pages.

* cited by examiner

ROBOT FOR HANDLING FLAT SUBSTRATES AS WELL AS ALIGNMENT FACILITY

FIELD

The invention relates to a robot for handling flat substrates. It further relates to an alignment facility suitable for such a robot, for example.

BACKGROUND

In the semi-conductor industry robots are employed for handling substrates, such as for example wafers. In particular, the robots enable transportation of one or more flat substrates which comprises taking up the substrates before they are transported and depositing them after transportation. The robots have a gripping facility with which the flat substrate(s) are taken up, transported, and deposited. Gripping facilities enabling the simultaneous handling of several flat substrates in technical language are also referred to as multiple-gripping facilities.

Various models of multiple-gripping facilities are known from the prior art. These are multiple-gripping facilities that enable horizontal substrate handling. In a horizontal substrate handling the surface sides of the flat substrate rest in horizontal planes.

The flat substrates often are sensitive. Therefore, they have to be gripped individually. Gripping as a block often is not possible. Therefore, a multiple-gripping facility has an own gripping element with positioning elements for each substrate. Additionally, a spacer, often referred to as a spacing piece, to establish the correct distance in the substrate storage place is required between these gripping elements. The gripping elements, the positioning elements, and the spacers together form the gripper pack of a multiple-gripping facility. However, the weight of the gripper pack increases with the increasing number of gripping elements, positioning elements, and spacers.

However, stiffness of materials is limited. For this reason, with multiple-gripping facilities that are to enable horizontal handling of substrates deformation (bending) of the arm to which such gripping elements are attached occurs due to gravity. This fact is further complicated by limiting factors such as limited space and requirements for mass saving to ensure the highest possible dynamics of the moved elements of the multiple-gripping facility including the gripping elements. Deformation of the arm results in the fact that the gripping elements or the gripper pack, respectively are no longer horizontally aligned. This involves enormous problems during pick up and deposition of the substrates, since these are horizontally arranged in the storage places and with a narrow distance which is also referred to as pitch. Since the arrangement of the substrates in industrial standards is standardized and small distances between the substrates are more effective an increase of the distances is not an option.

Deformation of the arm mainly goes back to the own weight of the gripper pack, while deformation going back to the tack up of substrates certainly is present, but usually is involved to a significantly smaller extent. Auxiliary solutions such as enclosing spacers are not serviceable. Making parts with tilted surfaces also cannot be regarded as being industrially suitable for horizontal handling.

In WO 99/62107 A1 a robot with a multiple-gripping facility is described which is to enable horizontal handling of substrates. The substrates rest on the gripping element referred to as end effectors that are fixed to a carrier block which is directly attached to the arm of the robot. In US 2003/0230384 A1 also a robot with a multiple-gripping facility is described that is to enable horizontal handling of substrates. The substrates rest on the gripping elements that are fixed in a holder which is directly attached to the arm of the robot.

FIGS. 1A, 1B, and 2 are to illustrate a multiple-gripping facility 200 according to the prior art in detail. The multiple-gripping facility 200 has a carrier block 202 that is attached to a robot arm 201 of a robot by means of fastening elements 205. The carrier block 202 forms the holder in which the gripping elements 203 are fixed. The number n of the gripping elements 203 depends on the intended application of the multiple-gripping facility 200. In FIG. 1, the gripping elements 203 are numbered with the numbers being given in square brackets. Flat substrates 101 rest on the gripping elements 203 in a horizontal alignment. The gripping elements 203 are spaced from each by spacers 204 which are part of the carrier block. The vertical distance between two adjacent gripping elements is the pitch. The carrier block 202 including the gripping elements 203 and the spacers 204 is a component of the multiple-gripping facility. In FIG. 1B, a flat substrate 101*a* with circular surface sides and a flat substrate 101*b* with squared surface sides resting on the gripping element 203 are shown. This is to illustrate that the gripping elements are suitable for taking up circular and squared substrates 101*a*, 101*b*, however actually only one substrate 101 is held by the gripping element 203. In FIG. 2, the deformation 206 of the arm 201 can be seen which mainly goes back to the own weight of the multiple-gripping facility.

So far, the drawbacks of robots with a multiple-gripping facility known up to now have hindered their industrial application. It is therefore desired to provide robots with multiple-gripping facilities which enable horizontal handling of substrates without overloading the robot arm.

SUMMARY

It is the subject of the invention to eliminate the drawbacks according to the prior art. In particular, it is to provide a robot enabling horizontal handling of substrates without overloading the robot arm. Further, it is to provide an alignment facility ensuring a horizontal position of substrates, for example.

According to the invention a robot for handling flat substrates is provided which has:

- one or more substrate holder(s) wherein each substrate holder is for horizontally holding respectively one of the substrates,
- a carrier block holding the substrate holder or if several substrate holders are provided holding the substrate holders spaced from each other, and
- a robot arm.

The carrier block is attached to the robot arm by means of an alignment facility with the alignment facility being designed for aligning the carrier block.

By means of the alignment facility the carrier block can be aligned such that the substrate holders enable holding of the substrates in a horizontal position. With the alignment facility the carrier block can be aligned. It is additionally to connect the carrier block and the robot arm. The carrier block together with the substrate holder(s) forms the active machine element. The carrier block together with the substrate holder(s) is also referred to as gripper block.

The substrate holders correspond to the gripping elements that have been described in connection with the prior art, for example in WO 99/62107 A1. Also, the carrier block can correspond to a carrier block known from the prior art, e.g., WO 99/62107 A1, apart from the fact that the carrier block is not directly attached to the arm of the robot, but to the alignment facility provided according to the invention. The robot and the robot arm can correspond to robots and robot arms known from the prior art, e.g., WO 99/62107 A1, apart from the fact that it is not the carrier block which is attached to the robot arm but the alignment facility provided according to the invention. The term "handling" is understood to mean taking up, transporting, and depositing a flat substrate.

If the robot according to the invention has several substrate holders then it may have one or more spacers as known per se in the prior art. By means of a spacer adjacent substrate holders can be held in a given distance, the pitch, from each other. The number of spacers corresponds to the number of the substrate holders reduced by 1. It may be provided that the spacers are part of the carrier block. It may be provided that the substrate holders and spacers are part of the carrier block.

The robot according to the invention is for handling flat substrates. The number of the flat substrates that can be handled by means of the robot corresponds to the number of its substrate holders. A flat substrate may be for example a wafer such as a silicon wafer. The term "flat substrate" is understood to mean a body that has a larger extension, typically a much larger extension, in two directions of a cartesian coordinate system than in the third direction of the cartesian coordinate system. In other words, the width and length of the flat substrate are larger, typically much larger, than its height. In flat substrates of substantially a circular cross-section its radius is greater than its height. A flat substrate may have a first surface side and a second surface side. Preferably, the first surface side and the second surface side are in parallel and in line to each other. By means of the robot according to the invention the flat substrate(s) may be held such that at least one of the surface sides of the respective substrate rests in a horizontal plane. Preferably, both surface sides of the respective substrate rest in horizontal planes.

The alignment facility can have a connecting element. In this case, the carrier block is attached to the robot arm via the connecting element. The connecting element can have a first leg and a second leg that are spaced from each other to form a gap. The alignment facility can further have at least one adjusting element for adjusting the distance between the first and second legs. By means of the adjusting element(s) the distance of the two legs in the vertical direction can be changed. It may be provided that the alignment facility has a first adjusting element and a second adjusting element. Preferably, the first adjusting element is a draw-in screw and the second adjusting element is a pressing screw. By means of the draw-in screw the distance between both legs can be changed. Also, by means of the pressing screw the distance between both legs can be changed. The draw-in screw and the pressing screw can be arranged next to each other. Preferably, the draw-in screw and the pressing screw have parallel or at least almost parallel rotation axes. In this case, the draw-in screw and pressing screw have parallel or at least almost parallel rotation axes. The adjusting element(s) can be arranged hidden in order to prevent an unintentional actuation.

By means of the draw-in screw a draw-in screw connection can be established between the first and second legs. Here, it may be provided that angle compensation parts are used to compensate an inclination of the draw-in screw. If the robot arm has no deformation the rotation axis is in its starting position, for example its rotation axis extends in the vertical. In case of a deformation of the robot arm the rotation axis of the draw-in screw can be inclined with respect to its starting position. Said inclination is preferably compensated, for example by means of one or more angle compensation parts.

The gap specifically weakens the connecting element. By applying limited forces by means of the adjusting element(s) a relative movement between both legs can be achieved.

It may be provided that the connecting element has a first segment to which the carrier block is attached, and a second segment which is attached to the robot arm, wherein the gap is formed in the second segment such that the second leg rests above the first leg. The connecting element can have a bar-shaped main body, wherein the gap is introduced on a front face of the main body. The first leg faces the bottom, the second leg faces away from the bottom.

It may be provided that the robot arm fits to the second leg. Preferably, the first segment adjoins to the second segment. It may be provided that the pressing screw is more spaced from the front face into which the gap is introduced than the draw-in screw. In other words, the draw-in screw is more spaced from the first segment than the pressing screw.

The adjusting element(s) can be used to enforce relative positions in positive and negative directions. Screwed connections can be established by means of simple machine elements. For example, there may be provided one or more pressing screws, one or more draw-in screws or a combination of one or more pressing screws and one or more draw-in screws. Then, depending on the compensation direction to be made to hold the flat substrate in a horizontal position the suitable screwed connection can be used for adjustment, while the other can serve for securing the adjustment.

A first through hole for passing through the draw-in screw can be formed in the first leg. In addition, a second through hole for establishing a screwed connection with the pressing screw can be formed in the first leg. The two holes in the first leg are through holes. Here, the pressing screw can fit to the second leg with the front face of its shank, namely preferably on the surface side of the second leg facing the gap between both legs. A hole for establishing a screwed connection with the draw-in screw can be formed in the second leg. Said hole is not a through hole. It may be formed on the surface side of the second leg facing the gap between both legs. By rotating the draw-in screw guided in the first leg through the first hole and screwed into the hole in the first leg the distance between the first leg and the second leg can be changed. By rotating the pressing screw guided through the second hole in the second leg and the front face of the shank of which fits to the first leg the distance between the first leg and the second leg can be changed. The distance can be reduced or enlarged. The term "distance of the legs" can refer to their distance on the front face of the second segment.

The connecting element preferably is prepared of a metallic material such as for example steel. It is for connecting the carrier block to the robot arm. The connecting element preferably is a single piece.

The adjusting element(s) preferably are prepared of a metallic material such as for example steel. They are for aligning the carrier block and with it the substrate holders, thereby ensuring a horizontal position of the flat substrates resting on the substrate holders.

With the alignment facility provided according to the invention the deformation of the robot arm can be compensated. It can be prepared in a relatively simple way without impairing its robustness and durability, it is very flexible in the geometric design and can be embodied as a light-weight element. All this does not impair robustness and durability.

With the alignment facility provided according to the invention inclinations of the carrier block and thus the substrate holders can be compensated. It is particularly suitable for gripping facilities which have one or more substrate holders. However, the alignment facility provided according to the invention can also be used to compensate other machine elements.

In addition to the already described deformations of the robot arm further sources for compliances and deformations, such as e.g., guiding elements, connections, adapters, further arms, housing- and frame parts, can exist in handling systems for taking up, transporting, and depositing flat substrates. In this case, the deformation occurring at the effective site, i.e., the robot arm, is the sum of all these single items. Such a deformation naturally is individual with each plant, even in case of otherwise identical embodiment, which is due to manufacturing and mounting tolerances. It is therefore advantageous if the alignment facility is arranged to the effective site as close as possible. In this way, further deformations between the alignment facility and the effective site can be prevented. For the same reason it is preferred that the alignment facility is embodied as compact as possible and light-weighted. Preferably, the alignment facility is maintenance-free and lifetime-proof and is composed of as less as possible single parts. The alignment facility according to the invention preferably is robust. It can simply and easily be adjusted by means of the adjusting element(s). Adjusting, for example by rotating the draw-in screw and/or the pressing screw, can be carried out by an operator of the robot.

The person of skill in the art is able to design the alignment facility provided according to the invention such that it is arranged as space saving as possible and without any disturbing contours. For that, the operating mode of the alignment facility described in the present application offers numerous variation possibilities. Moreover, the skilled person is able to arrange the adjusting elements hidden in order to prevent an unintentional de-adjustment. All customary and known solutions for positioning and connecting machine elements can be used in combination with said alignment facility.

The robot according to the invention can be used for handling one or more flat substrates. If the robot according to the invention shall only be used for handling one single flat substrate, then it has only one single substrate holder. In this case it is a single gripper. If the robot according to the invention shall only be used for handling two or more flat substrates, then is has the respective number of substrate holders. In this case it is a multiple or multi-gripper. Single grippers and multiple grippers commonly are also referred to as substrate grippers.

The alignment facility provided according to the invention can be used to prevent inclination of substrate grippers, particularly of single grippers or multiple grippers, by establishing an adjustable connection between gripping elements and robot arm. Robots enabling horizontal handling of flat substrates, for example in the form of single and multiple grippers, up to now don't have adjustable elements via which the gripping facilities are connected to the respective handling systems, in particular to the robot arm of a robot.

According to the invention further provided is an alignment facility for aligning a carrier block holding one or more substrate holders spaced from each other, wherein the substrate holders each are for horizontally holding one flat substrate. The alignment facility has a connecting element with a first leg and a second leg which are spaced from each other to form a gap, wherein the alignment facility further has at least one adjusting element for adjusting the distances between the first and the second leg.

Details on the alignment facility according to the invention have already been explained in connection with the robot according to the invention. Reference is made to these explanations.

The alignment facility according to the invention is suitable for all types of machine elements and assemblies which have shape and position tolerances due to their arrangement and the space position of which should be adjusted for correct function.

BRIEF DESCRIPTION OF THE FIGURES

In the following, the invention is explained in detail with the help of examples not intended to limit the invention with reference to the drawings. Here.

(FIG. 1A: side view; FIG. 1B: plan view);

DETAILED DESCRIPTION

Figure 1A:
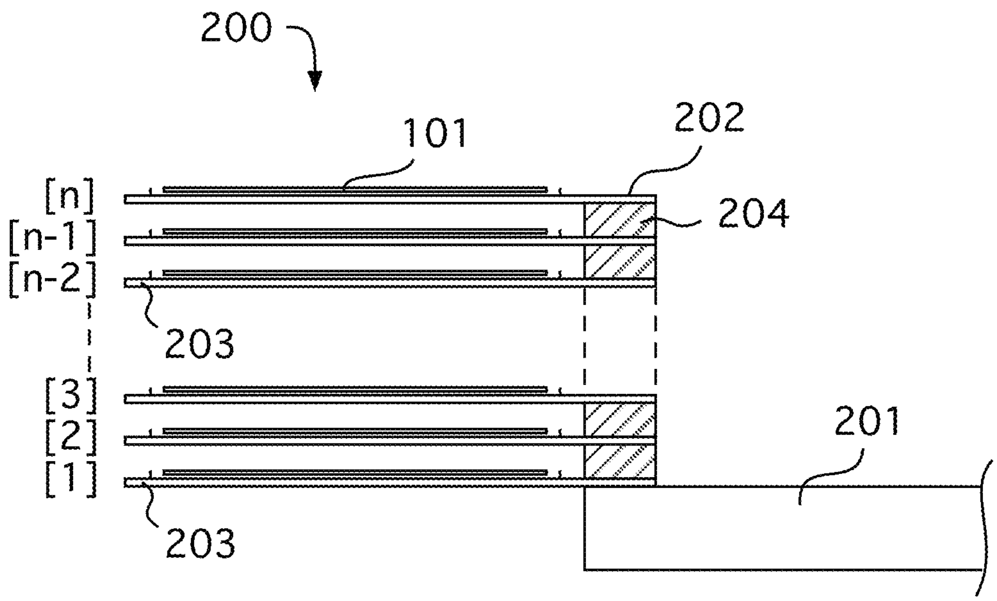
[Prior Art] Fig. 1A
FIG. 1A shows a schematic representations of a side view of a multiple-gripping facility according to the prior art.
Figure 1B:
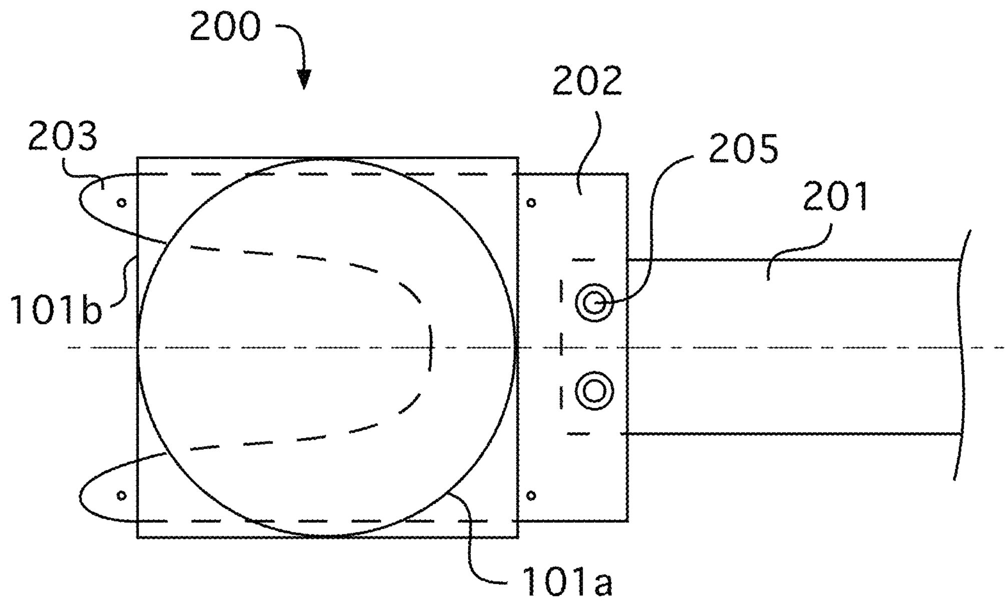
[Prior Art] Fig. 1B
FIG. 1B shows a schematic representations of a plan view of a multiple-gripping facility according to the prior art
Figure 2:
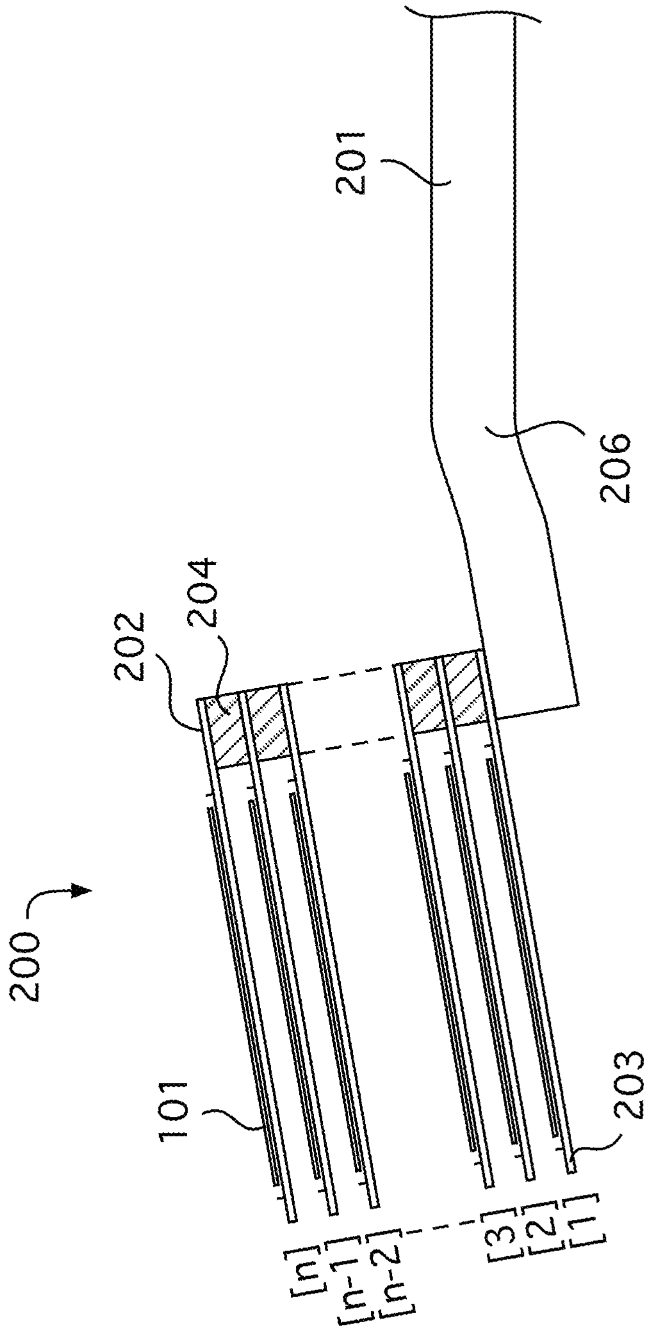
[Prior Art] Fig. 2
FIG. 2 shows a schematic side view of the multiple-gripping facility according to the prior art shown in FIG. 1 with the arm being deformed.
Figure 3A:
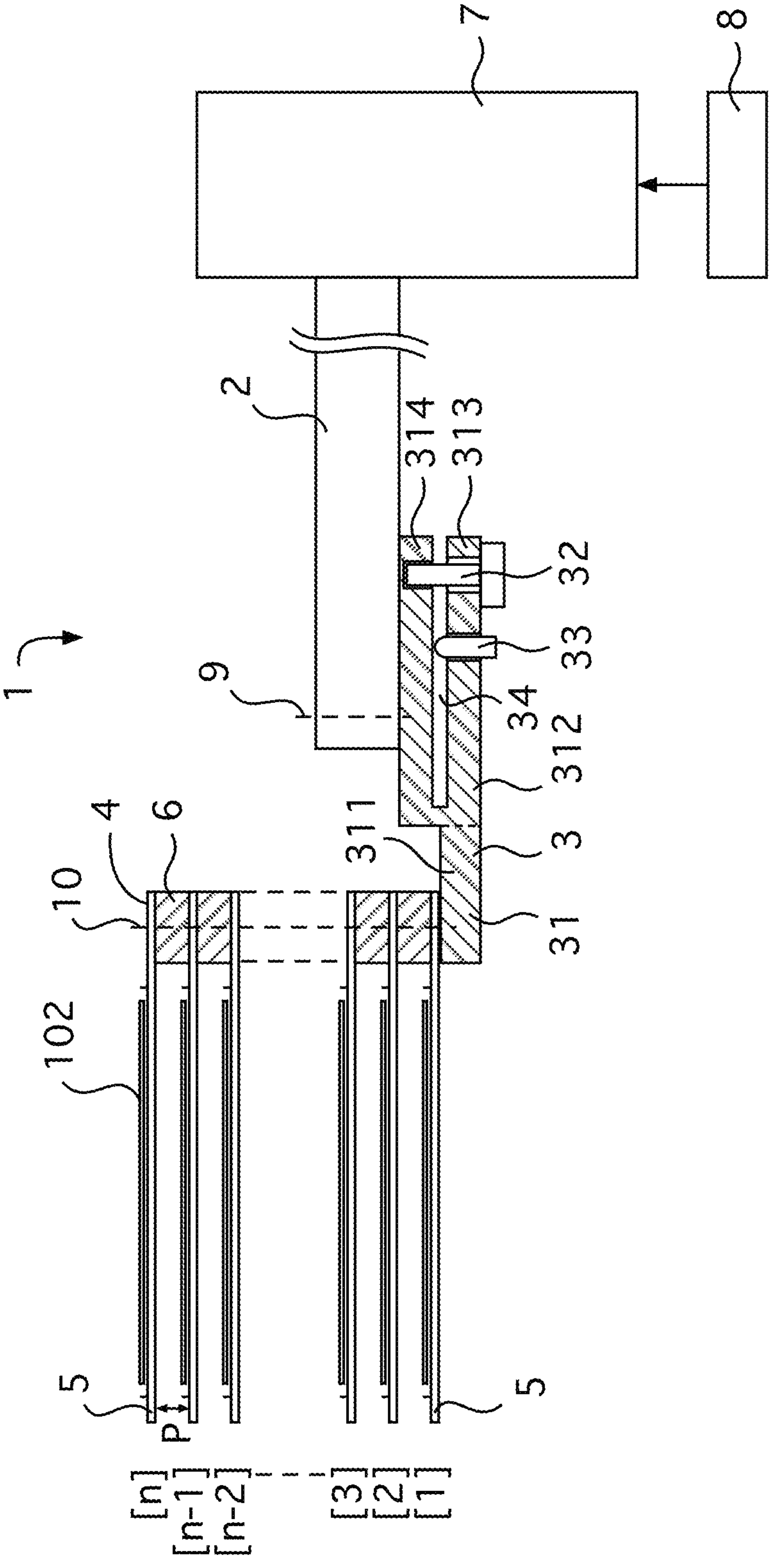
FIG. 3A shows a schematic representation of a sectional view from the side with the alignment facility being shown sectioned of an embodiment of a robot according to the invention.
Figure 3B:
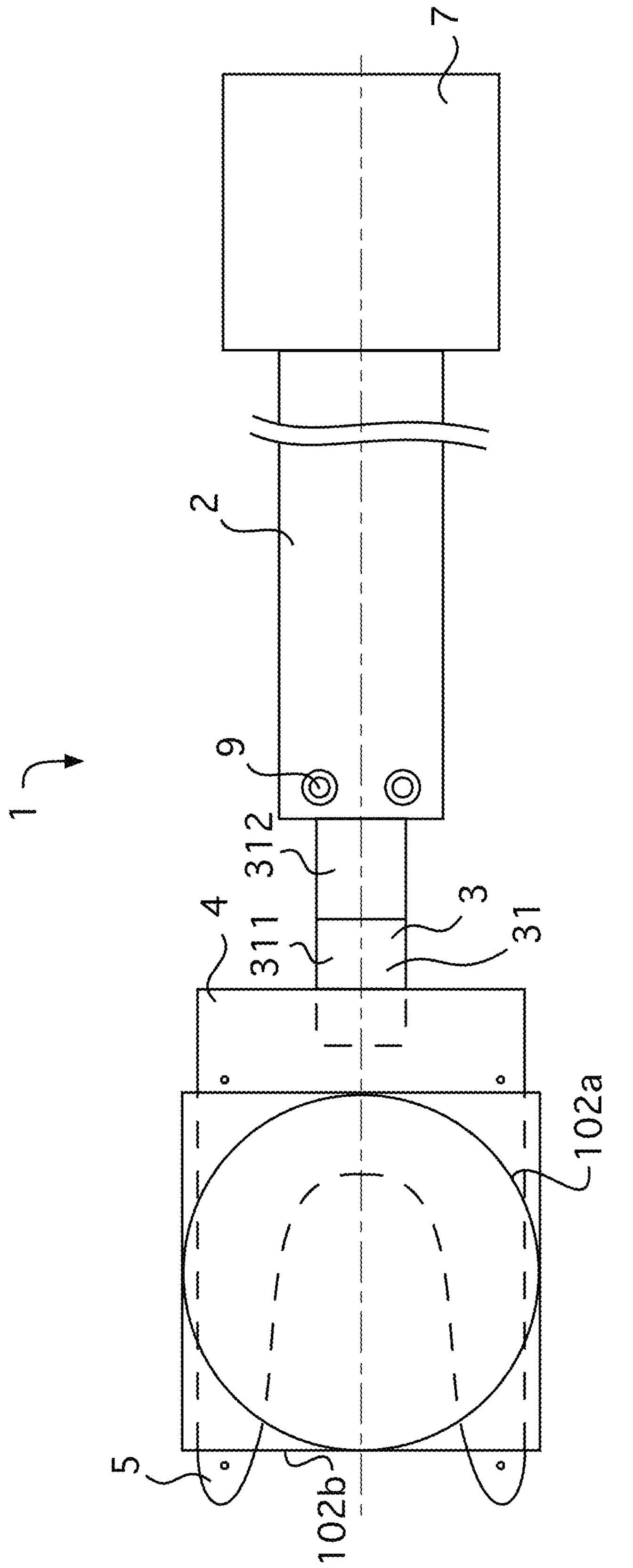
FIG. 3B shows a schematic representation of a plan view of an embodiment of a robot according to the invention.
Figure 5:
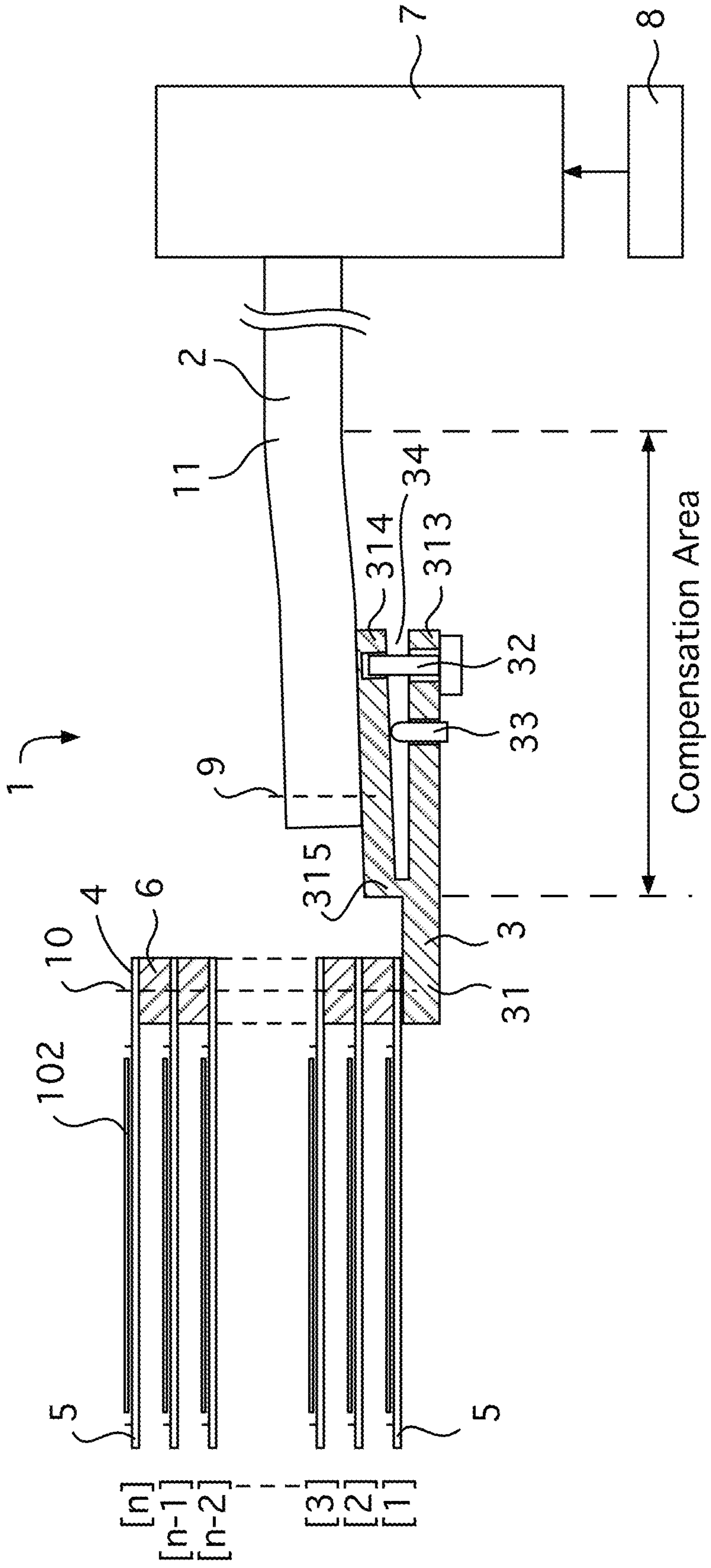
FIG. 5 shows a schematic representation of the embodiment of a robot according to the invention with deformed robot arm shown in FIG. 3.

The embodiment of a robot 1 according to the invention shown in FIG. 3 has a robot arm 2 to which an alignment facility 3 is attached. Additionally, a carrier block 4 is attached to the alignment facility 3 which carries several substrate holders 5 for horizontally holding wafers 102. The substrate holders 5 represent the gripping elements. Here, adjacent substrate holders 5 can be held in a given distance, the pitch P, to each other by means of spacers 6. The number n of the substrate holders 5 depends on the intended application of the robot 1 according to the invention. For this reason, in FIGS. 3A and 5 the carrier block 4 is partially illustrated with dashed lines. In addition, the substrate holders 5 are numbered, wherein the number is given in square brackets. The robot arm 2 is mounted to a basis 7 in a known manner and can be moved via a control 8, as described for example in WO/9962107. The robot 1 shown in FIG. 3 corresponds to industrial robots for handling flat substrates such as for example wafers 102 that are known per se aside from the alignment facility 3.

The alignment facility 3 has a connecting element 31, a draw-in screw 32, and a pressing screw 33. The connecting element 31 has a bar-shaped main body with a first segment 311 and a second segment 312. The longitudinal axis A of the bar-shaped main body extends from the robot arm 2 to the carrier block 4. The first segment 311 and the second segment 312 adjoin each other. The carrier block 4 is attached to the first segment 311 by means of one or more fastening elements 10. The second segment 312 is attached to the robot arm 2 by means of fastening elements 9. To simplify the illustration, in FIGS. 3A and 5 fastening elements 9, 10 are only indicated by a dashed line.

The connecting element 31 has a first front face 31*a* formed on the first segment 311 and a second front face 31*b* formed on the second segment. The connecting element 31 further has a lower side 31*c* and an upper side 31*d* connected to each other via longitudinal sides 31*e*, 31*f*. The lower side 31*c* faces the bottom, the upper side 31*d* faces away from the bottom. In the upper side 31*d* there is a surface offset at which the first segment 311 adjoins the second segment 312.

A gap 34 is formed on the second front face 31*b* of the connecting element 31 which extends towards the first front face 31*a* and over the whole extension of the connecting element 31 between the longitudinal sides 31*e*, 31*f*. Thus, the gap 34 is open at the second front face 31*b* of the second segment 312 and at the longitudinal sides 31*e*, 31*f*. The gap 34 is limited by a first leg 313 and a second leg 314 which are part of the second segment 312 and are connected via a basis 315 which is also part of the second segment 312. Accordingly, the second segment 312 has a U-shaped cross-section. The gap 34 substantially extends in the horizontal direction, the surface sides of the two legs 313, 314 limiting it are almost in a horizontal plane, as far as an adjustment by means of the draw-in screw 32 and the pressing screw 33 with which the alignment of the legs 313, 314 can be changed is disregarded. The second segment 312 at its upper side being part of upper side 31*d* fits to the robot arm 2.

Figure 4A:
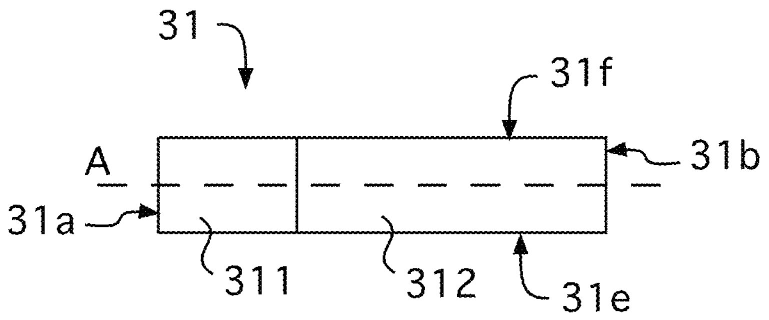
FIG. 4A shows a schematic representation of a plan view of the alignment facility.
Figure 4B:
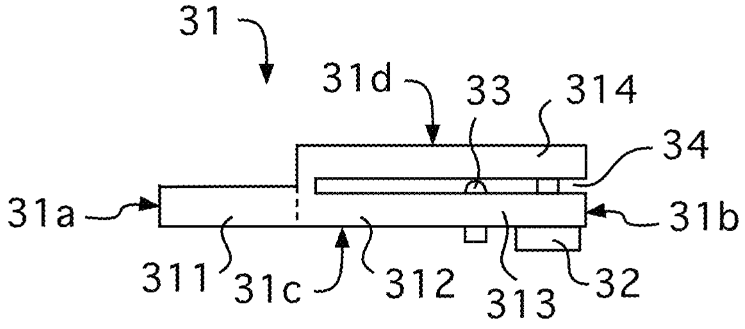
FIG. 4B shows a schematic representation of a side view of the alignment facility.
Figure 4C:
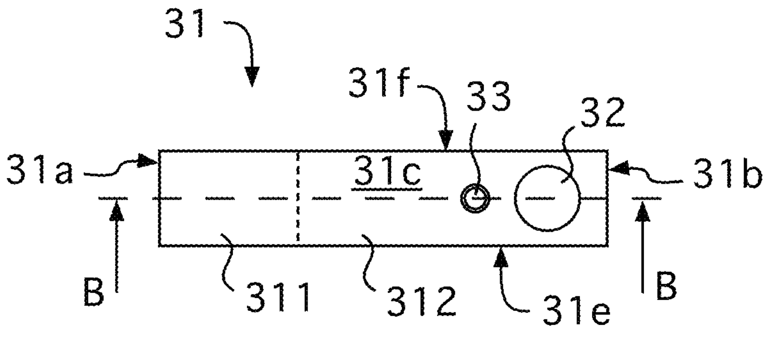
FIG. 4C shows a schematic representation of a bottom view of the alignment facility.
Figure 4D:
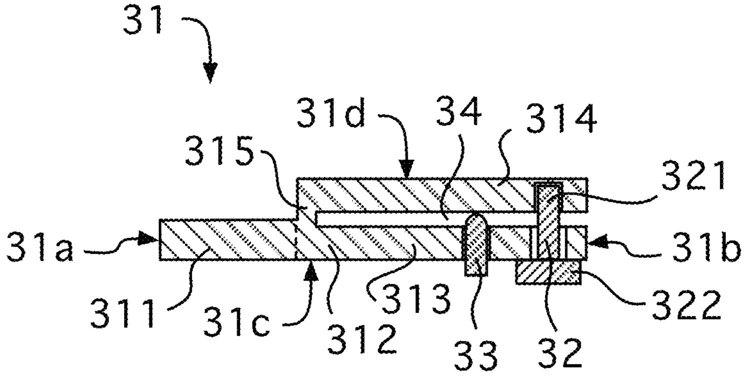
FIG. 4D shows a schematic representation of a sectional view along line of cut B-B of FIG. 4C of the alignment facility.
Figure 4E:
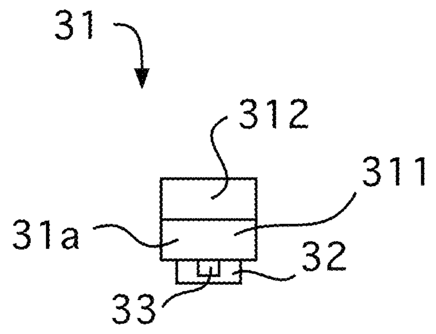
FIG. 4E shows a schematic representation of a view to the first front face of the alignment facility.
Figure 4F:
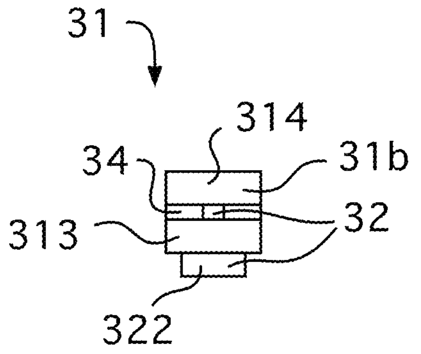
FIG. 4F shows a schematic representation of a view to the second front face of the alignment facility.
Figure 4G:
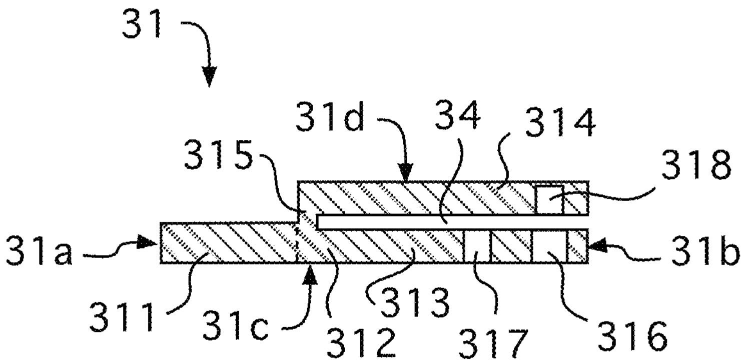
FIG. 4G shows a schematic representation of a sectional view along line of cut B-B of FIG. 4C without illustration of the screws of the alignment facility.

A first through hole 316 for the draw-in screw 32 and a second through hole 317 are formed in the first leg 313 (see FIG. 4G). In the second leg 314 a hole 318 is formed into which the draw-in screw 32 is screwed. For that, the hole 318 has a female thread with which a male thread engages which is formed on the shank 321 of the draw-in screw 32. The first through hole 316 has no female thread. However, the draw-in screw 32 with the screw head 322 fits to the lower side 31*c* of the connecting element 31. By rotating the draw-in screw the extension of the gap 34 between both legs 313, 314 can be changed. The second through hole 317 has a female thread with which a male thread engages which is formed on the shank of the pressing screw 33. The pressing screw 33 extends into the gap 34 and can fit to the second leg 314 with the front face of its shank. By rotating the pressing screw, the extension of the gap 34 between both legs 313, 314 can be changed. It can be seen in FIG. 5 that a deformation 11 of the robot arm 2 can be compensated by means of both screws 32, 33. The wafer 102 despite of the deformation 11 is in a horizontal position. Here, the length of the gap 34 determines a compensation area extending from the basis 315 of the second segment 312 to the effective site of the deformation 11 of the robot arm 2. It is further seen in FIG. 5 that the alignment facility is arranged close to the effective site of the deformation 11.

The draw-in screw 32 and the pressing screw 33 are preferably centered with respect to the extension of the connecting element 31 between its longitudinal sides 31*e*, 31*f*. The distance of the pressing screw 33 from the front face 31*b* of the connecting element 31 is greater than the distance of the draw-in screw 32 from said front face. The rotation axes of the draw-in screw 32 and the pressing screw 33 almost extend in the vertical.

LIST OF REFERENCE SYMBOLS

1 robot
2 robot arm
3 alignment facility
4 carrier block
5 substrate holder
6 spacer
7 basis
8 control
9 fastening element
10 fastening element
11 deformation
31 connecting element
31*a* first front face
31*b* second front face
31*c* lower side
31*d* upper side
31*e* longitudinal side
31*f* longitudinal side
311 first segment
312 second segment
313 first leg
314 second leg
315 basis
316 first through hole
317 second through hole
318 hole
32 draw-in screw
321 shank
322 screw head
33 pressing screw
34 gap
101 flat substrate
101*a* flat substrate with circular surface sides
101*b* flat substrate with squared surface sides
102 wafer
200 multiple-gripping facility
201 arm
202 carrier block
203 gripping element
204 spacer
205 fastening element
206 deformation

The invention claimed is:

1. A robot for handling flat substrates, comprising:

one or more substrate holder(s) wherein each substrate holder is for horizontally holding respectively one of the substrates, a carrier block holding the substrate holder or if several substrate holders are provided holding the substrate holders spaced from each other, a robot arm, and an alignment facility coupled to the carrier block and to the robot arm, wherein the alignment facility is configured to align the carrier block, and wherein the alignment facility comprises a connecting element having a first segment that is attached to the carrier block and a second segment which is attached to the robot arm, the second segment having a basis element with a first leg and a second leg cantilevered outward from the basis element, wherein the first leg and the second leg are spaced apart from each other to form a gap.

2. The robot according to claim 1, wherein the alignment facility further has at least one adjusting element for adjusting the distance between the first and the second leg.

3. The robot according to claim 2, wherein the alignment facility has a first adjusting element and a second adjusting element, wherein the first adjusting element is a draw-in screw and the second adjusting element is a pressing screw.

4. The robot according to claim 3, wherein a first through hole for passing through the draw-in screw and a second through hole for establishing a screwed connection with the pressing screw are formed in the first leg, wherein the pressing screw with the front face of its shank fits to the second leg.

5. The robot according to claim 4, wherein a hole for establishing a screwed connection with the draw-in screw is formed in the second leg.

6. The robot according to claim 3, wherein the draw-in screw and the pressing screw are arranged next to each other.

7. The robot according to claim 3, wherein the draw-in screw and the pressing screw have parallel or at least almost parallel rotation axes.

8. The robot according to claim 2, wherein the gap is formed in the second segment such that the second leg is above the first leg.

9. The robot according to claim 8, wherein the robot arm fits to the second leg.

10. The robot according to claim 8, wherein the first segment adjoins to the second segment and that the draw-in screw is more spaced from the first segment than the pressing screw.

11. An alignment facility for aligning a carrier block that holds one or more substrate holders spaced from each other, the alignment facility configured to couple to the carrier block, wherein each of the substrate holders each is for horizontally holding a flat substrate, wherein the alignment facility comprises a connecting element configured to couple to a robot arm, wherein the connecting element having a first segment for attaching to the carrier block and a second segment for attaching to the robot arm, the second segment having a basis element with a first leg and a second leg cantilevered outward from the basis element, wherein the first leg and the second leg are spaced from each other to form a gap, wherein the alignment facility further has at least one adjusting element for adjusting the distance between the first and the second leg.

12. The alignment facility according to claim 11, further comprising a first adjusting element and a second adjusting element, wherein the first adjusting element is a draw-in screw and the second adjusting element is a pressing screw.

13. The alignment facility according to claim 12, wherein the draw-in screw and the pressing screw are arranged next to each other.

14. The alignment facility according to claim 12, wherein the draw-in screw and the pressing screw have parallel or at least almost parallel rotation axes.

15. The alignment facility according to claim 11, wherein the gap is formed in the second segment such that the second leg is above the first leg.

* * * * *